(12) United States Patent
Lee et al.

(10) Patent No.: US 7,728,411 B2
(45) Date of Patent: Jun. 1, 2010

(54) COL-TSOP WITH NONCONDUCTIVE MATERIAL FOR REDUCING PACKAGE CAPACITANCE

(75) Inventors: Ming Hsun Lee, Taichung (TW); Cheemen Yu, Madison, WI (US); Hem Takiar, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 338 days.

(21) Appl. No.: 11/354,441

(22) Filed: Feb. 15, 2006

(65) Prior Publication Data

US 2007/0187805 A1    Aug. 16, 2007

(51) Int. Cl.
*H01L 23/495* (2006.01)
*H01L 23/48* (2006.01)

(52) U.S. Cl. .............. 257/666; 257/676; 257/686; 257/692; 257/701; 257/783; 438/123

(58) Field of Classification Search ................ 257/666, 257/676, 686, 687, 701, 692, 783; 438/123
See application file for complete search history.

(56) References Cited

U.S. PATENT DOCUMENTS

| | | | | |
|---|---|---|---|---|
| 5,596,225 A | * | 1/1997 | Mathew et al. ............ | 257/667 |
| 5,796,159 A | * | 8/1998 | Kierse ..................... | 257/668 |
| 6,225,683 B1 | * | 5/2001 | Yalamanchili et al. ...... | 257/666 |
| 6,731,011 B2 | | 5/2004 | Verma et al. | |
| 6,858,470 B1 | | 2/2005 | Han et al. | |
| 7,339,257 B2 | * | 3/2008 | Ozawa et al. ............ | 257/666 |
| 2004/0089717 A1 | | 5/2004 | Harari et al. | |
| 2004/0104457 A1 | * | 6/2004 | Tan et al. .................. | 257/666 |
| 2005/0023651 A1 | * | 2/2005 | Kim et al. ................. | 257/666 |
| 2005/0087846 A1 | | 4/2005 | Han et al. | |
| 2006/0103012 A1 | * | 5/2006 | Chin ....................... | 257/712 |
| 2007/0001272 A1 | * | 1/2007 | Lee et al. ................. | 257/666 |

FOREIGN PATENT DOCUMENTS

JP    6-177429    *    6/1994

* cited by examiner

*Primary Examiner*—Kenneth A Parker
*Assistant Examiner*—Joseph Nguyen
(74) *Attorney, Agent, or Firm*—Vierra Magen Marcus & DeNiro LLP

(57) ABSTRACT

A method of fabricating a semiconductor package, and a semiconductor package formed thereby, are disclosed. The semiconductor package may include one or more semiconductor die having die attach pads along a single side. The leadframe may include a plurality of elongated electrical leads, extending from a first side of the leadframe, beneath the die, and terminating at a second side of the leadframe adjacent to the bond pads along the single edge of the die. The leadframe may further include a dielectric spacer layer on the elongated leads. Spacing the semiconductor die from the elongated leads using the spacer layer reduces the parasitic capacitance and/or inductance of the semiconductor package formed thereby.

21 Claims, 7 Drawing Sheets

COL-TSOP WITH NONCONDUCTIVE MATERIAL FOR REDUCING PACKAGE CAPACITANCE

BACKGROUND OF THE INVENTION

1. Field of the Invention

Embodiments of the present invention relate to a method of fabricating a semiconductor package, and a semiconductor package formed thereby.

2. Description of the Related Art

As the size of electronic devices continue to decrease, the associated semiconductor packages that operate them are being designed with smaller form factors, lower power requirements and higher functionality. Currently, sub-micron features in semiconductor fabrication are placing higher demands on package technology including higher lead counts, reduced lead pitch, minimum footprint area and significant overall volume reduction.

One branch of semiconductor packaging involves the use of a leadframe, which is a thin layer of metal on which one or more semiconductor die may be mounted. The leadframe includes electrical leads for communicating electrical signals from the one or more semiconductors to a printed circuit board or other external electrical devices. Common leadframe-based packages include plastic small outlined packages (PSOP), thin small outlined packages (TSOP), and shrink small outline packages (SSOP). Components in a conventional leadframe package are shown in FIGS. 1 and 2. The illustrated components may be used for example in a TSOP package, which come standard in 32-lead, 40-lead, 48-lead and 56-lead packages (fewer leads are shown in the figures for clarity).

FIG. 1 shows a leadframe 20 before attachment of a semiconductor die 22. A typical leadframe 20 may include a number of leads 24 having first ends 24a for attaching to semiconductor die 22, and a second end (not shown) for affixing to a printed circuit board or other electrical component. Leadframe 20 may further include a die attach pad 26 for structurally supporting semiconductor die 22 on leadframe 20. While die attach pad 26 may provide a path to ground, it conventionally does not carry signals to or from the semiconductor die 22. In certain leadframe configurations, it is known to omit die attach pad 26 and instead attach the semiconductor die directly to the leadframe leads in a so-called chip on lead (COL) configuration.

Semiconductor leads 24 may be mounted to die attach pad 26 as shown in FIG. 2 using a die attach compound. Semiconductor die 22 is conventionally formed with a plurality of die bond pads 28 on first and second opposed edges on the top side of the semiconductor die. Once the semiconductor die is mounted to the leadframe, a wire bond process is performed whereby bond pads 28 are electrically coupled to respective electrical leads 24 using a delicate wire 30. The assignment of a bond pad 28 to a particular electrical lead 24 is defined by industry standard specification. FIG. 2 shows less than all of the bond pads 28 being wired to leads 24 for clarity, but each bond pad may be wired to its respective electrical in conventional designs. It is also known to have less than all of the bond pads wired to an electrical as shown in FIG. 2.

FIG. 3 shows a cross-sectional side view of leadframe 20 and semiconductor die 22 after the wire bond process. Once wire bonding is completed, a molding process performed to encase the components in a molding compound 34 and form the finished package. It is known to recess or "down-set" the semiconductor die within the leadframe, as shown in FIG. 3, in order to balance the semiconductor die against the forces of the molding compound as it flows around the die and leadframe. It is important that the semiconductor die be balanced during molding process as an imbalance can cause excessive movement of the semiconductor die under the force of the molding compound as it flows. Such movement can break or short one or more of the wire bonds 28, resulting in damage or complete failure of the semiconductor package. As there may be fifty or more wire bonds in a package, this can become a significant problem if the semiconductor die is not properly balanced during the molding process.

It is also know during the molding process in a down-set packaging configuration that a higher concentration of molding compound flows over the top of the semiconductor die in the molding process. This results in a downward force on top of the semiconductor die. Without the die attach pad 26 or other proper structural support, the die and leadframe may get forced downward until one or more of the electrical leads attaching to the die are exposed to the external environment at the bottom of the package. This again may result in damage or failure of the package.

As shown in FIGS. 2 and 3 it is typical to have bond pads 28 on first and second opposite sides of the semiconductor die for electrical coupling with their respective leads. According to industry specification and ease of design, bond pads along the first edge of the semiconductor die connect to respective pins adjacent to first edge, and bond pads along the second edge of the semiconductor die connect to respective pins adjacent the second edge.

In an effort to reduce semiconductor die form factor, it is now known to provide bond pads on a semiconductor die along only one edge of the die as shown in FIG. 4. A leadframe operating with such die may include a plurality of elongated electrical leads, extending from a first side of the leadframe, beneath the die, and terminating at a second side of the leadframe adjacent to the bond pads along the single edge of the die. However, use of such a leadframe in a COL configuration may increase parasitic capacitance and/or inductance between the elongated leads and the semiconductor die on the elongated leads. High levels of parasitic capacitance and/or inductance can adversely affect the operation of the semiconductor package.

SUMMARY OF THE INVENTION

Embodiments of the present invention in general relate to a method of fabricating a semiconductor package, and a semiconductor package formed thereby. The semiconductor package may include one or more semiconductor die having die attach pads along a single side, and a leadframe for supporting the one or more semiconductor die in a chip-on-lead (COL) configuration. The leadframe may include a plurality of elongated electrical leads, extending from a first side of the leadframe, beneath the die, and terminating at a second side of the leadframe adjacent to the bond pads along the single edge of the die.

The leadframe may further include a dielectric spacer layer on the elongated leads. The spacer layer may be any of various dielectric materials, and have a thickness of between 3 and 5 mils. Spacing the semiconductor die from the elongated leads using the spacer layer reduces the parasitic capacitance and/or inductance of the semiconductor package formed thereby. The spacer layer may be formed on the top surface of the leadframe. Additionally, a structural member may be mounted on a bottom surface of the leadframe, for example in multiple die configuration. In such embodiments, a second spacer layer may be provided between the structural member and the bottom surface of the leadframe to prevent or reduce parasitic capacitance and/or inductance between the structural member and the leads of the leadframe.

The semiconductor die and leadframe may be used, for example, to form a TSOP 48-pin configuration. The leadframe may be fabricated in a separate process than the assembly processes of mounting and connecting semiconductor die. The spacer layer may affixed to the leadframe either at the time the leadframe is fabricated, or later, during the assembly processes where the semiconductor die are mounted to the leadframe.

DETAILED DESCRIPTION

Embodiments of the present invention will now be described in reference to FIGS. 5-11 which in general relate to a method of fabricating a semiconductor package, and a semiconductor package formed thereby. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
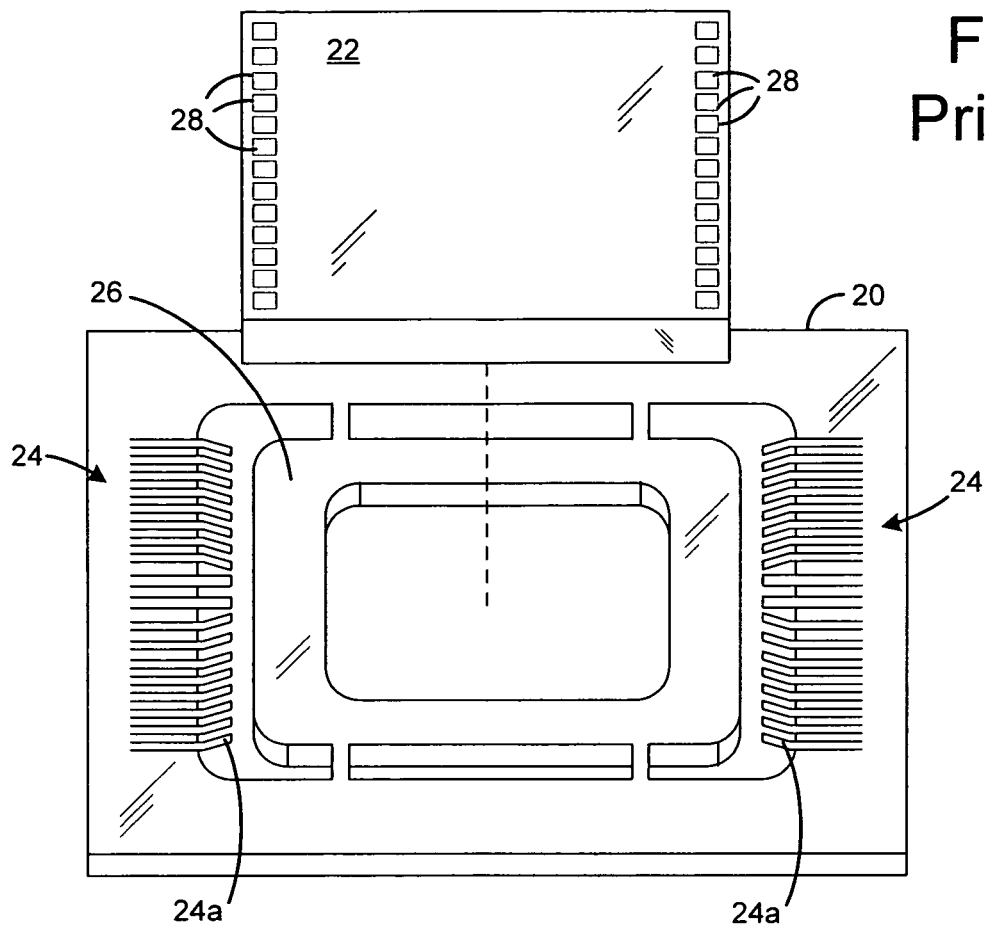
FIG. 1 is and exploded perspective view of a conventional leadframe and semiconductor die.
Figure 2:
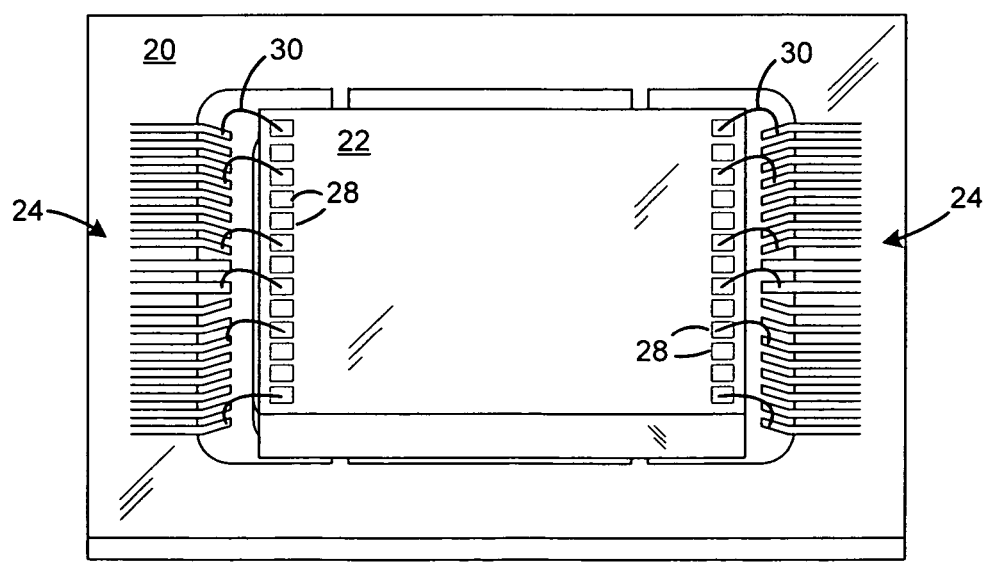
FIG. 2 is a perspective view of a conventional semiconductor die wire-bonded to a conventional leadframe.
Figure 3:
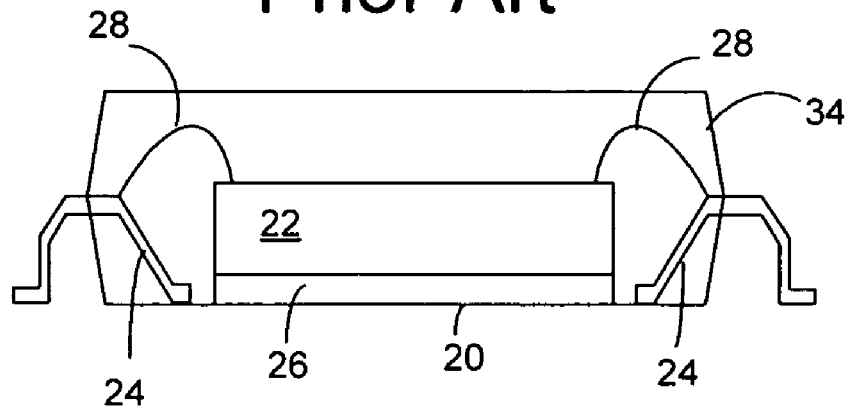
FIG. 3 is a cross-sectional side view of a conventional semiconductor package including a semiconductor die and leadframe encased in molding compound.
Figure 4:
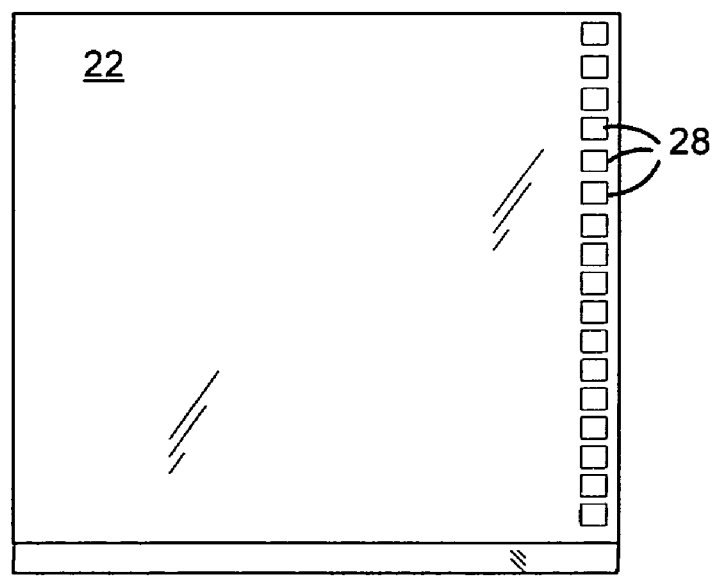
FIG. 4 is a conventional view of a semiconductor die including semiconductor bond pads along a single edge of the semiconductor die.
Figure 5:
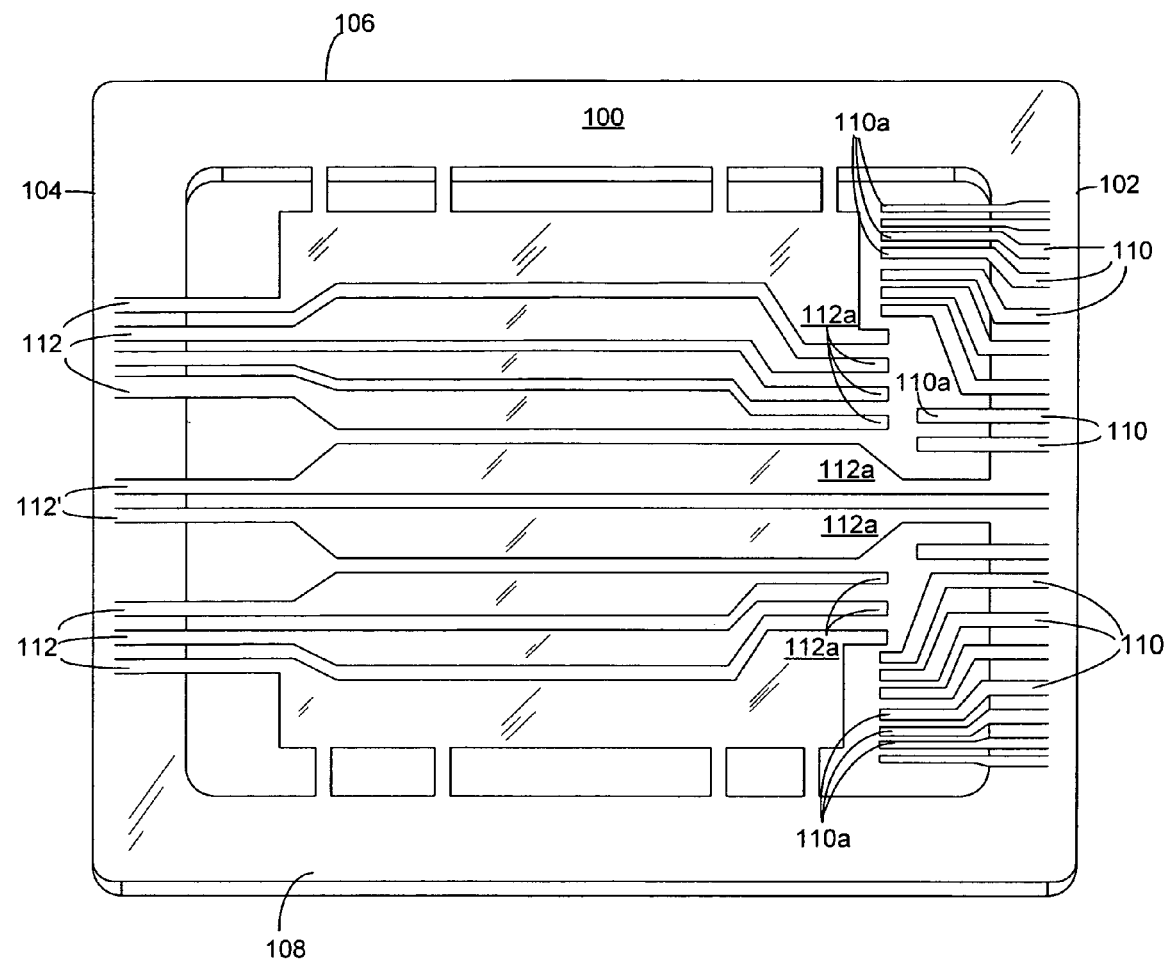
FIG. 5 is a perspective view of a leadframe for use with the present invention of the present invention.
Figure 9:
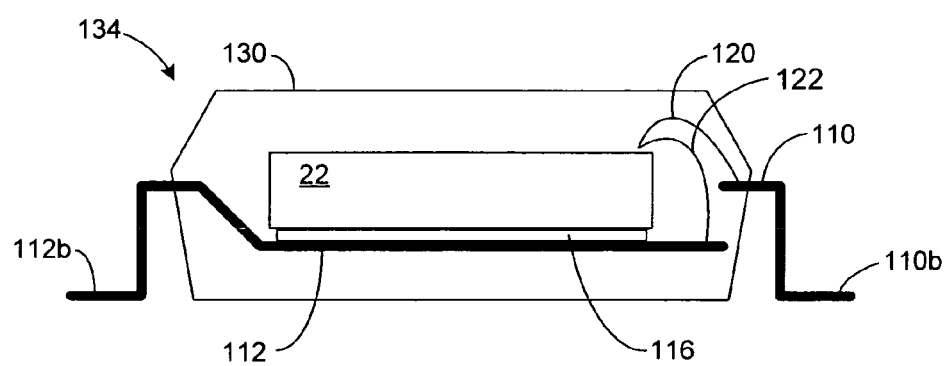
FIG. 9 is a cross-sectional side view of a semiconductor package according the present invention including a semiconductor die and leadframe encased within a molding compound.

Referring to FIG. 5, a leadframe 100 is shown having elongated leads for establishing electrical communication with a semiconductor die having die bond pads along a single edge of the die, such as shown in FIG. 4. Leadframe 100 includes first and second opposed sides 102 and 104 and third and fourth opposed sides 106 and 108 extending generally between sides 102 and 104. Side 102 includes a plurality of electrical leads 110 having first ends 110a for connection to bond pads on a semiconductor, and second ends 110b for connection to an external device such as a printed circuit board (ends 110b are not shown in FIG. 5, but are seen in FIG. 9).

Side 104 of leadframe 100 similarly includes a plurality of electrical leads, referred to as leads 112. However, leads 112 extend from side 104 across the interior of the leadframe generally parallel to sides 106 and 108 and have ends 112a terminating proximate to ends 110a near side 102. Despite the proximity of the ends of leads 112 and 110 near side 102, leads 110 and 112 are separate and electrically isolated from each other. Leads 112 may include second ends 112b opposite ends 112a for connection to an external device such as a printed circuit board (ends 112b are not shown in FIG. 5, but are seen in FIG. 9). In embodiments, the leadframe 100 may be formed of copper or copper alloys, plated copper or plated copper alloys, Alloy 42 (42Fe/58Ni), copper plated steel, or other metals and materials known for use on substrates.

One or more of the leads 112 may extend between and be attached to both sides 102 and 104 of leadframe 100, such as for example the leads indicated at 112'. Leads 112' connected to both sides 102 and 104 do not carry electrical signals from the semiconductor die, but may be used for an electrical ground for the semiconductor die, as well as providing structural support for the semiconductor die mounted thereon as explained hereinafter. Leads 112' that connect to both sides 102 and 104 may be omitted in alternative embodiments of the present invention.

It is understood that the configuration of the various leads 112 and 110 shown in the figures is one possible configuration of many. Those of skill in the art would appreciate a wide variety of configurations including short leads 110 and elongated leads 112 extending beneath the semiconductor die. While the elongated electrical leads 112 have been described as coming from side 104 and extending towards side 102, it is understood that the respective positions of leads 110 and 112 may be reversed to operate with semiconductor die having wire bond pads along an edge opposite to that shown in the figures.

Figure 6:
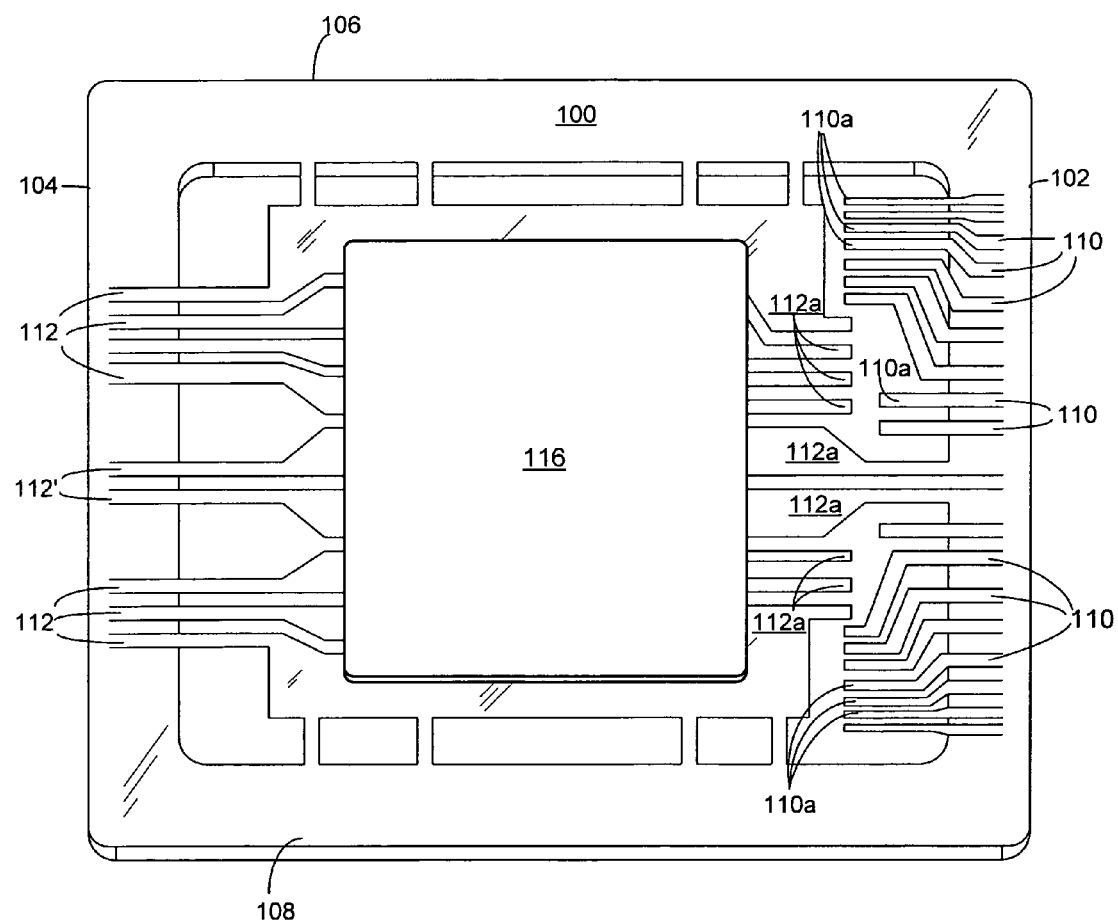
FIG. 6 is a perspective view of a leadframe including a spacer layer according to an embodiment of the present invention.

As indicated in the Background section, parasitics such capacitance and/or inductance between elongated leads 112 and semiconductor die affixed thereto (explained hereinafter) may adversely affect the operation of the semiconductor package. Thus, as shown in FIG. 6, leadframe 100 may further include a dielectric spacer layer 116 on leads 112 which rests between the leads 112 and semiconductor die. Spacer layer 116 may be any of various dielectric materials, including for example a polyimide adhesive tape affixed across electrical leads 112. In alternative embodiments, spacer layer 116 may be formed of other isolative films and materials, including epoxy resins (FR-4, FR-5) or bismaleimide triazine (BT) adhered to electrical leads 112.

Spacer layer 116 may be between 2 and 8 mils thick in embodiments, and may be between 3 and 5 mils thick in alternative embodiments. It is understood that spacer layer 116 may be thinner than 2 mils and thicker than 8 mils in further embodiments. Spacing the semiconductor die from the leads 112 using spacer layer 116 with the disclosed thicknesses reduces the parasitic capacitance and/or inductance of the semiconductor package formed thereby. The spacer layer 116 may have a length and width approximately equal to, slightly smaller than or slightly larger than a semiconductor die mounted thereon. As an alternative to being a single rectangle, the spacer layer 116 may be split into two or more strips that are affixed to leads 112.

Spacer layer 116 may be provided on the top surface of the leads 112 (the surface receiving semiconductor die 22). Additionally, as explained hereinafter, a spacer layer may also be provided on the bottom surface of leads 112. The bottom spacer layer may be a dielectric adhesive, film or material, and may be the same as or different than the spacer layer on the top surface.

Figure 7:
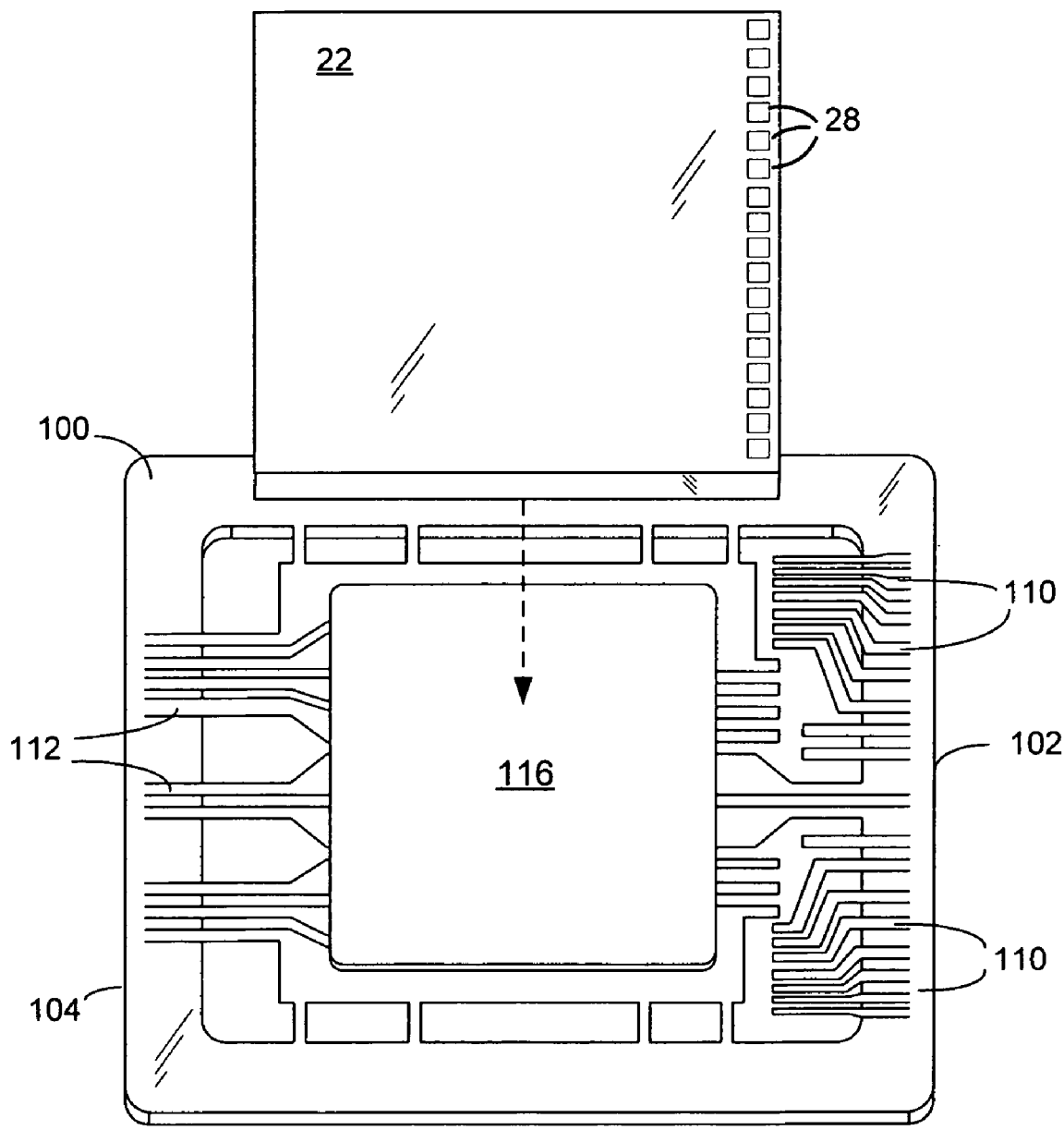
FIG. 7 is an exploded perspective view of a leadframe according an embodiment of the present invention and a semiconductor die having bond pads along a single edge.

FIG. 7 shows an exploded perspective view of a conventional semiconductor die 22 to be mounted on leadframe 100. Semiconductor die 22 may be bonded to spacer layer 116 of leadframe 100 using a dielectric die-attach compound. As indicated above, semiconductor die 22 may include a plurality of die bond pads 28 down a side of semiconductor die lying adjacent leadframe side 102 when the die is attached. It is understood that semiconductor 22 may include die bond pads at other locations of the semiconductor die. However, the leadframe 100 including spacer layer 116 according to the present invention may be used any time it is desired to electrically couple die bond pads along a single edge of a semiconductor die with first and second opposed sides of the leadframe. It is contemplated that leadframe 100 may include additional leads on side 104 for connecting with die bond pads on semiconductor die 22 in the event that semiconductor die 22 has die bond pads on first and second opposed sides.

Figure 8:
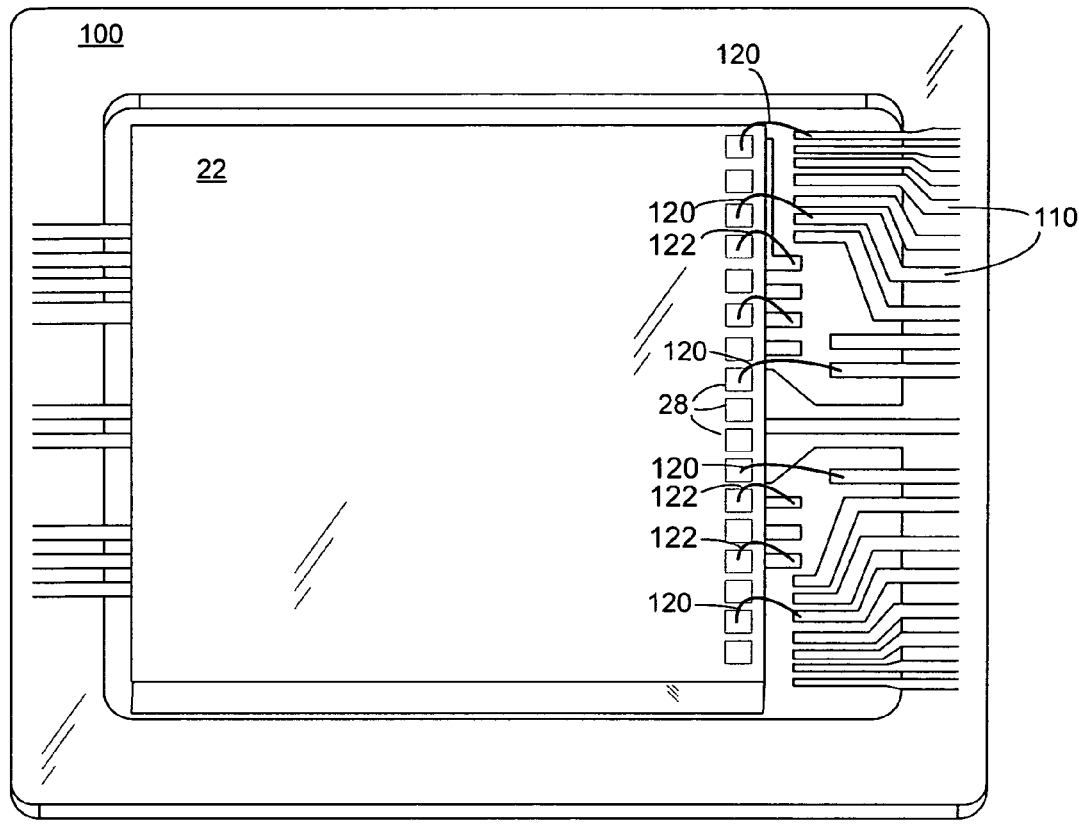
FIG. 8 is a perspective view of a semiconductor die wire-bonded to a leadframe according to an embodiment of the present invention.

FIG. 8 shows die 22 affixed to leads 112 in leadframe 100. Once die 22 is attached, the die bond pads 28 may be wire-bonded to the respective electrical leads 110 and 112 in a known wire-bond process. As dictated by industry standard or customized specification, some of the wire bond pads 28 may be electrically coupled to electrical leads 110, as shown for example by wire bonds 120 and other die bond pads 28 may be electrically coupled to electrical leads 112 as shown by wire bonds 122. In embodiments, some of the die bond pads 28 may remain unconnected to either leads 110 or 112. Alternatively, embodiments, each of the die bonds pads 28 may be wire-bonded to one of the electrical leads 110, 112. In embodiments, the leads 112 of leadframe 100 allow the semiconductor die 22 to be used in an industry standard pinout configuration.

It is understood that the leadframe 100 may fabricated in processes that are separate from, and possibly at a different location than, the assembly processes of mounting and connecting semiconductor die 22. The spacer layer 116 (including one or both spacer layers 116a and 116b) may affixed to the leadframe 100 either at the time the leadframe is fabricated, or later, during the assembly processes where semiconductor die 22 are mounted to the leadframe.

FIG. 9 is a cross-sectional side view of a semiconductor die 22 mounted on electrical leads 112 and wire-bonded to electrical leads 110 and 112 as described above. In embodiments, electrical leads 112 may be angled so as to provide a down-set configuration. After the wire-bond process as described above, semiconductor 22, wire-bonds 120, 122 and portions of leads 110 and 112 may be encapsulated in molding compound 130 in a known process to form a semiconductor die package 134. Although not required, leadframe 100 according to the above-described embodiments may maintain the same pinout assignments as for a semiconductor die having die pads along two edges. Once fabrication of semiconductor die package 134 is completed and the package is tested, the package 134 may then be surface-mounted to an electrical component such as a printed circuit board in a known surface mount process.

Embodiments of the present invention described thus far have included a single semiconductor die 22. It is understood that more than one semiconductor die may be included in package 134 in alternative embodiments of the present invention. The embodiment shown in FIG. 10 includes three semiconductor die 22a, 22b, and 22c. It is understood that two or more than three semiconductor die may be used in alternative embodiments of the present invention. Each of the die may include die bond pads along the single edge, and may be offset as shown so that all three semiconductor die may be bonded off of a single edge to both electrical leads 110 and 112 as described above and as shown by the wire bond 120, 122 in FIG. 10.

Figure 10:
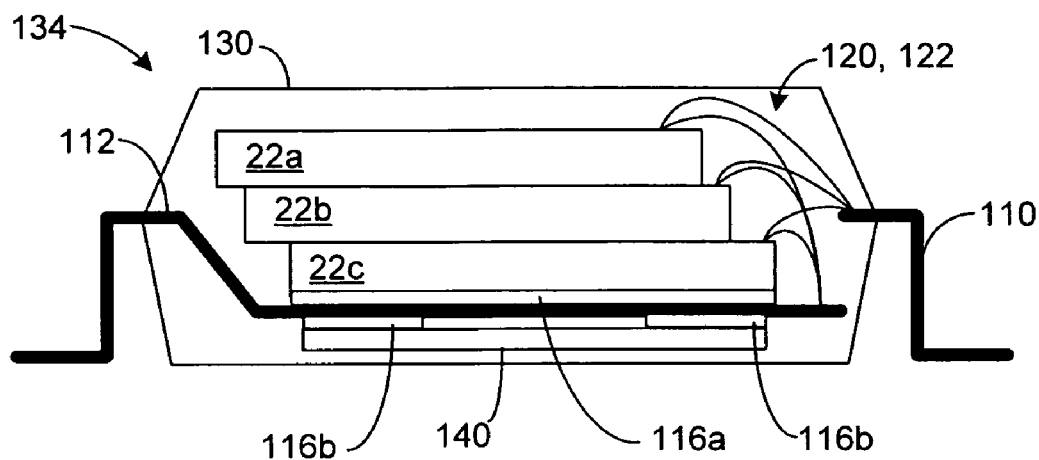
FIG. 10 is a cross-sectional side view of a semiconductor package including a plurality of semiconductor die, a structural member and a second spacer layer according to embodiments of the present invention.

In single die configurations, such as shown in FIG. 9, or in multiple die configurations such as in FIG. 10, the leadframe 100 may include a structural member 140 for providing structural support to the package 134 and to prevent warpage of the package 134. The structural member 140 may be made of various materials, including semiconductor material.

After the molding process and any finishing required for package 134, the structural member 140 may be completely encapsulated within the package 134, or a bottom surface of structural member 140 may be exposed to the environment outside of package 134 without consequence to the operation of package 134. In addition to structural support, structural member 140 may further increase the balance of the leadframe during the molding process to prevent excessive movement of semiconductor die and to minimize the likelihood of damage to the wire bond between the die and leadframe. Moreover, structural member 140 insulates and prevents exposure of electrical leads 112 outside of the package.

The single semiconductor die of FIG. 9 and the multiple semiconductor die embodiment of FIG. 10 may operate using structural member 140. However, it is understood that the embodiments of FIGS. 9 and 10 may operate without structural member 140.

Mounting structural member 140 directly to the bottom surface of the leadframe 100 may result in parasitic capacitance and/or inductance. Therefore, as indicated above, a second spacer layer may be provided between the structural member 140 and the bottom surface of the leadframe. FIG. 10 shows a semiconductor package 134 in cross-section having a spacer layer 116a on the top surface of the leadframe 100 and a pair of spacer layer strips 116b on the bottom surface of leadframe 100 between the structural member 140 and the leadframe 100. Instead of strips, the spacer layer 116b may have the same configuration as spacer layer 116a. Both spacer layers 116a and 116b may have a thickness of between 2 and 8 mils, and more particularly between 3 and 5 mils. The thickness of layers 116a, 116b may be less than 2 mils and greater than 8 mils in alternative embodiments.

In the embodiment of FIG. 10, each of the semiconductor die 22a, 22b, and 22c have die bond pads along a single common edge. In a further embodiment, at least on the die may include die bond pads along a single edge and at least one other of the die have wire-bond pads along two opposite edges. In such an embodiment, semiconductor package 134 may include electrical leads 110 and 112 adjacent the first edge of the semiconductor die as shown in FIG. 10. The package 134 may further include additional electrical leads (not shown) extending from side 104 on leadframe 100 adjacent the second, opposite edge of the semiconductor die. These additional electrical leads may electrically couple to die bond pads along that edge.

In a still further embodiment, it is contemplated that a first semiconductor die include die bond pads along only a first edge, and a second semiconductor die include die bond pads only along a second edge opposite the first edge. For such an embodiment, it is contemplated that the first side of the leadframe include both short electrical leads (as in leads 110) and long electrical leads extending beneath the semiconductor die (as in leads 112). The second side of the leadframe similarly includes short electrical leads and long electrical leads extending beneath the semiconductor die. In such embodiments, the semiconductor die may be physically attached to both sets of long electrical leads, and the long electrical leads may be interwoven with each other without contacting each other. Thus, the leadframe 100 in such an embodiment would be capable of connecting die bond pads along a first edge of a die to leads on both sides of the leadframe, and the leadframe 100 would be capable of connecting die bond pads along a second, opposite edge of a die to leads on both sides of the leadframe.

Figure 11:
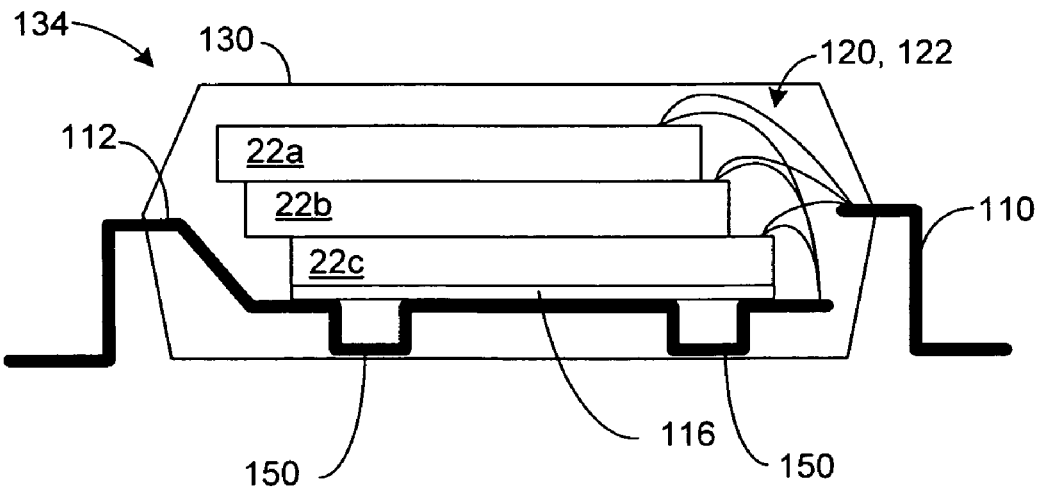
FIG. 11 is a cross-sectional side view of a semiconductor package including a double down-set configuration according to a further embodiment of the present invention.

FIG. 11 illustrates a further embodiment of the present invention including a "double down-set" leadframe configuration. In the embodiment of FIG. 11, leads 112 are formed with a first down-set as shown and described above, and two or more second down-sets 150. Down-sets 150 add rigidity to the leadframe 100 and may prevent warpage of the package 134. Given the added rigidity of the double down-set configuration, the structural member 140 and second spacer layer may be omitted in the embodiment of FIG. 11. However, it is understood that the structural member and second spacer layer may be used with the double down-set leadframe 100 of FIG. 11 in alternative embodiments.

The above-described semiconductor die and leadframe may be used to form a TSOP 48-pin configuration. It is understood however that the number of pins and the type of leadframe package may vary significantly in alternative embodiments of the present invention. Although the type of die used is not critical to the present invention, the semiconductor die used in package 134 may be flash memory chips (NOR/NAND), SRAM or DDT, and/or a controller chip such as an ASIC. Other integrated circuit die for performing other functions are contemplated.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. In a chip-on-lead semiconductor package having a semiconductor die affixed to a leadframe without a leadframe die paddle, a method of reducing capacitance and/or inductance, comprising the steps of:
    (a) affixing a spacer layer in the form of one of a polyimide tape or a dielectric film to a first surface of the leadframe;
    (b) affixing the semiconductor die to the spacer layer using an adhesive layer separate from the spacer layer;
    (c) affixing a rigid member, separate from the leadframe, first spacer layer and adhesive layer, to a second surface of the leadframe, the second surface of the leadframe being opposite the first surface of the leadframe; and
    (d) encapsulating the semiconductor package within mold compound with the spacer layer and semiconductor die rigid member and portions of the leadframe completely encapsulated within the mold compound.

2. The method of claim 1, said step a) further comprising the step of affixing a spacer layer having a thickness of between 2 mils and 8 mils to the leadframe.

3. In a chip-on-lead semiconductor package having a semiconductor die affixed to a leadframe without a leadframe die paddle, the semiconductor die having die bond pads along a single side and the leadframe having elongated leads to connect to the die bond pads on the single side, a method of reducing capacitance and/or inductance between the semiconductor die and the elongated leads, comprising the steps of:
    (a) affixing an adhesive spacer layer formed of polyimide tape having a thickness of between 3 mils and 5 mils to a first surface of the elongated leads;
    (b) affixing the semiconductor die to the spacer layer using an adhesive layer separate from the polyimide tape;
    (c) affixing a rigid member to a second surface of the elongated leads, the second surface of the elongated leads being opposite the first surface of the elongated leads, the rigid member being separate from the leadframe, adhesive spacer layer and adhesive layer and the rigid member not being a die paddle or a heat sink; and
    (d) encapsulating the semiconductor package within mold compound, a bottom surface of the rigid member being exposed through the mold compound.

4. The method of claim 3, further comprising:
    (e) affixing a second adhesive spacer layer formed of polyimide tape having a thickness of between 3 mils and 5 mils between the second surface of the elongated leads and the rigid member.

5. In a chip-on-lead semiconductor package having a semiconductor die affixed to a leadframe without a leadframe die paddle, a method of reducing capacitance and/or inductance, comprising the steps of:
    a) affixing a first spacer layer having a thickness of between 2 mils and 8 mils to a first surface of the leadframe;
    b) affixing the semiconductor die to the first spacer layer using an adhesive layer separate from the spacer layer, the first spacer layer reducing the parasitic capacitance of the semiconductor package;
    c) affixing a second spacer layer having a thickness of between 2 mils and 8 mils to a second surface of the leadframe; and
    d) affixing a structural member to the second spacer layer.

6. The method of claim 5, said step a) of affixing a first spacer layer having a thickness of between 2 mils and 8 mils to the leadframe comprising the step of affixing a polyimide tape to the leadframe.

7. The method of claim 5, said step a) of affixing a first spacer layer having a thickness of between 2 mils and 8 mils to the leadframe comprising the step of affixing a dielectric film to the leadframe.

8. The method of claim 5, said step a) of affixing a first spacer layer having a thickness of between 2 mils and 8 mils to the leadframe comprising the step affixing a first spacer layer having a thickness of between 3 mils and 5 mils to the leadframe.

9. The method of claim 5, said step c) of affixing a second spacer layer having a thickness of between 2 mils and 8 mils to the leadframe comprising the step of affixing a polyimide tape to the leadframe.

10. The method of claim 5, said step c) of affixing a second spacer layer having a thickness of between 2 mils and 8 mils to the leadframe comprising the step of affixing a dielectric film to the leadframe.

11. The method of claim 5, said step c) of affixing a second spacer layer having a thickness of between 2 mils and 8 mils to the leadframe comprising the step of affixing a second spacer layer having a thickness of between 3 mils and 5 mils to the leadframe.

12. A chip-on-lead semiconductor package, comprising:
a leadframe including elongated leads, the elongated leads having a first surface and a second surface opposed to the first surface;
a first spacer layer affixed to the first surface of the elongated leads using an adhesive layer separate from the first spacer layer, the first spacer layer reducing the parasitic capacitance of the semiconductor package;
one or more semiconductor die;
an adhesive layer for affixing the one or more semiconductor die to the first spacer layer;
a second spacer layer affixed to the second surface of the elongated leads; and
a silicon structural member affixed to the second spacer layer.

13. A chip-on-lead semiconductor package as recited in claim 12, the first and second spacer layers comprising a polyimide adhesive tape.

14. A chip-on-lead semiconductor package as recited in claim 12, the first and second spacer layers comprising one of an epoxy resin or bismaleimide triazine.

15. A chip-on-lead semiconductor package as recited in claim 12, the first spacer layer comprising a pad affixed to the first surface of the elongated leads.

16. A chip-on-lead semiconductor package as recited in claim 12, the first spacer layer comprising two or more strips affixed to the first surface of the elongated leads.

17. A chip-on-lead semiconductor package as recited in claim 12, the second spacer layer comprising a pad affixed to the second surface of the elongated leads.

18. A chip-on-lead semiconductor package as recited in claim 12, the second spacer layer comprising two or more strips affixed to the second surface of the elongated leads.

19. A chip-on-lead semiconductor package as recited in claim 12, the semiconductor package comprising a plastic small outlined package.

20. A chip-on-lead semiconductor package as recited in claim 12, the semiconductor package comprising a thin small outlined package.

21. A chip-on-lead semiconductor package as recited in claim 12, the semiconductor package comprising a shrink small outline package.

* * * * *

(12) EX PARTE REEXAMINATION CERTIFICATE (10471st)
United States Patent
Lee et al.

(10) Number: US 7,728,411 C1
(45) Certificate Issued: Jan. 12, 2015

(54) COL-TSOP WITH NONCONDUCTIVE MATERIAL FOR REDUCING PACKAGE CAPACITANCE

(75) Inventors: Ming Hsun Lee, Taichung (TW); Cheemen Yu, Madison, WI (US); Hem Takiar, Fremont, CA (US)

(73) Assignee: SanDisk Technologies Inc., Plano, TX (US)

Reexamination Request:
No. 90/020,040, Nov. 19, 2013

Reexamination Certificate for:
Patent No.: 7,728,411
Issued: Jun. 1, 2010
Appl. No.: 11/354,441
Filed: Feb. 15, 2006

(51) Int. Cl.
*H01L 23/495* (2006.01)
*H01L 23/48* (2006.01)

(52) U.S. Cl.
USPC ........... 257/666; 257/686; 257/692; 257/701; 257/783; 257/123

(58) Field of Classification Search
None
See application file for complete search history.

(56) References Cited

To view the complete listing of prior art documents cited during the proceeding for Reexamination Control Number 90/020,040, please refer to the USPTO's public Patent Application Information Retrieval (PAIR) system under the Display References tab.

*Primary Examiner* — Leonardo Andujar

(57) ABSTRACT

A method of fabricating a semiconductor package, and a semiconductor package formed thereby, are disclosed. The semiconductor package may include one or more semiconductor die having die attach pads along a single side. The leadframe may include a plurality of elongated electrical leads, extending from a first side of the leadframe, beneath the die, and terminating at a second side of the leadframe adjacent to the bond pads along the single edge of the die. The leadframe may further include a dielectric spacer layer on the elongated leads. Spacing the semiconductor die from the elongated leads using the spacer layer reduces the parasitic capacitance and/or inductance of the semiconductor package formed thereby.

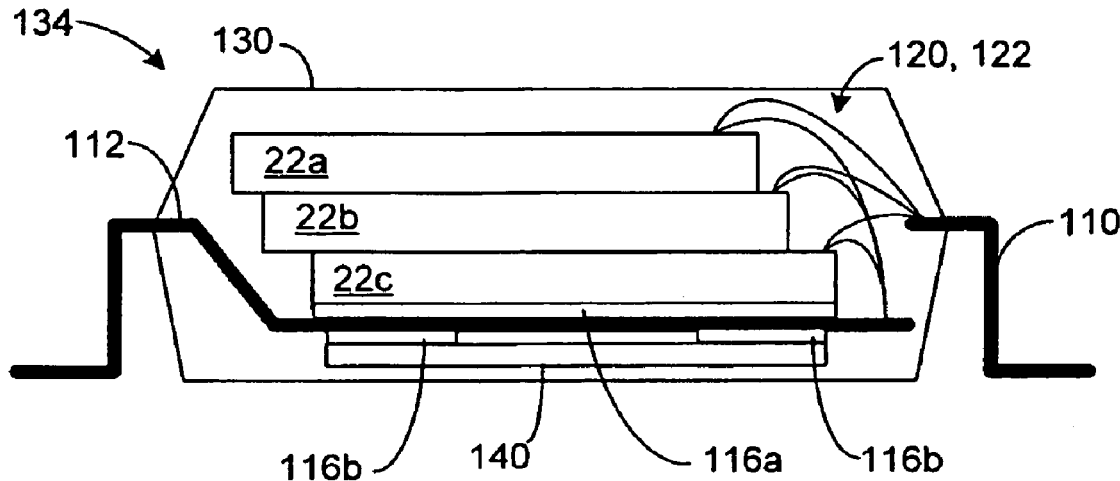

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-4 are cancelled.

Claims 5 and 12 are determined to be patentable as amended.

Claims 6-11 and 13-21, dependent on an amended claim, are determined to be patentable.

5. In a chip-on-lead semiconductor package having a semiconductor die affixed to a leadframe [without] *including a first set of electrical leads and a second set of electrical leads, the first set of electrical leads being longer than the second set of electrical leads, the first set of electrical leads having first and second sides and the leadframe not including* a leadframe die paddle, a method of reducing capacitance and/or inductance, comprising the steps of:
  a) affixing a first spacer layer having a thickness of between 2 mils and 8 mils to [a first surface] *the first side* of the *first set of electrical leads of the leadframe and not the second set of electrical leads of the* leadframe;
  b) affixing the semiconductor die to the first spacer layer using an adhesive layer separate from the spacer layer, the first spacer layer reducing the parasitic capacitance of the semiconductor package;
  c) affixing a second spacer layer having a thickness of between 2 mils and 8 mils to [a second surface] *the second side of the first set of electrical leads and not the second set of electrical leads of the* leadframe; and
  d) affixing a structural member to the second spacer layer; *wherein all semiconductor die in the semiconductor package are positioned on the first side of the first set of electrical leads of the leadframe.*

12. A chip-on-lead semiconductor package, comprising:
a leadframe including *a first set of* elongated *electrical* leads [, the elongated leads having a first surface and a second surface opposed to the first surface] *and a second set of electrical leads, the first set of elongated electrical leads being longer than the second set of electrical leads, the first set of elongated electrical leads having first and second sides*;
a first spacer layer [affixed to the first surface of the elongated leads] *affixed to the first side of the first set of elongated electrical leads and not the second set of electrical leads* using an adhesive layer separate from the first spacer layer, the first spacer layer reducing the parasitic capacitance of the semiconductor package;
one or more semiconductor die;
an adhesive layer for affixing the one or more semiconductor die to the first spacer layer;
a second spacer layer [affixed to the second surface of the elongated leads] *affixed to the second side of the first set of elongated electrical leads and not the second set of electrical leads*; [and]
*molding compound encapsulating the one or more semiconductor die, the first and second spacer layers and portions of the leadframe; and*
a silicon structural member affixed to the second spacer layer;
*wherein all semiconductor die in the semiconductor package are positioned on the first side of the first set of elongated electrical leads of the leadframe.*

\* \* \* \* \*